United States Patent
Tangring et al.

(10) Patent No.: US 10,121,936 B2
(45) Date of Patent: Nov. 6, 2018

(54) OPTOELECTRONIC SEMICONDUCTOR CHIP COMPRISING A MULTI-QUANTUM WELL COMPRISING AT LEAST ONE HIGH BARRIER LAYER

(71) Applicant: OSRAM Opto Semiconductors GmbH, Regensburg (DE)

(72) Inventors: Ivar Tangring, Regensburg (DE); Felix Ernst, Mainz (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/645,813

(22) Filed: Jul. 10, 2017

(65) Prior Publication Data
US 2017/0309777 A1  Oct. 26, 2017

Related U.S. Application Data

(63) Continuation of application No. 14/907,230, filed as application No. PCT/EP2014/065750 on Jul. 22, 2014, now Pat. No. 9,722,140.

(30) Foreign Application Priority Data

Jul. 25, 2013 (DE) .................. 10 2013 107 969

(51) Int. Cl.
    *H01L 29/06* (2006.01)
    *H01L 31/00* (2006.01)
    (Continued)

(52) U.S. Cl.
    CPC .............. *H01L 33/06* (2013.01); *H01L 33/32* (2013.01)

(58) Field of Classification Search
    CPC ........ B82Y 20/00; H01L 33/06; H01S 5/3407; H01S 5/3416; H01S 5/34333
    See application file for complete search history.

(56) References Cited

U.S. PATENT DOCUMENTS

| 5,502,739 A | 3/1996 | Kidoguchi et al. |
| 5,636,236 A | 6/1997 | Tada et al. |
| (Continued) | | |

FOREIGN PATENT DOCUMENTS

| CN | 102130246 A | 7/2011 |
| CN | 102822995 A | 12/2012 |
| (Continued) | | |

*Primary Examiner* — Ismail Muse
(74) *Attorney, Agent, or Firm* — Slater Matsil, LLP

(57) ABSTRACT

An optoelectronic semiconductor chip including a multi-quantum well including at least one high barrier layer is disclosed. In an embodiment, the chip includes a p-type semiconductor region, an n-type semiconductor region and an active layer suitable for emission of radiation arranged between the p-type region and the n-type region, wherein the active layer is in the form of a multiple quantum well structure. The multiple quantum well structure has a plurality of alternating quantum well layers and barrier layers, wherein a barrier layer arranged closer to the p-type region than to the n-type region is a high barrier layer having an electronic band gap $E_{hb}$ that is larger than electronic band gaps $E_b$ of other barrier layers, and wherein a quantum well layer that adjoins the high barrier layer on a side facing towards the p-type region has a thickness that is greater than thicknesses of other quantum well layers.

18 Claims, 5 Drawing Sheets

(51) Int. Cl.
  *H01L 33/06* (2010.01)
  *H01L 33/32* (2010.01)

(56) References Cited

U.S. PATENT DOCUMENTS

| | | | |
|---|---|---|---|
| 8,008,647 B2 | 8/2011 | Park et al. | |
| 8,379,684 B1 | 2/2013 | Bhat et al. | |
| 8,575,592 B2 | 11/2013 | Bergmann et al. | |
| 8,779,425 B2 | 7/2014 | Moon et al. | |
| 2003/0197188 A1* | 10/2003 | Watatani | B82Y 20/00 257/88 |
| 2004/0051107 A1 | 3/2004 | Nagahama et al. | |
| 2008/0093593 A1* | 4/2008 | Ryu | B82Y 20/00 257/13 |
| 2008/0308787 A1 | 12/2008 | Lee et al. | |
| 2009/0045392 A1 | 2/2009 | Park et al. | |
| 2009/0090923 A1 | 4/2009 | Murayama | |
| 2010/0019256 A1 | 1/2010 | Wu et al. | |
| 2010/0046205 A1 | 2/2010 | Chu et al. | |
| 2011/0272667 A1* | 11/2011 | Takayama | B82Y 20/00 257/13 |
| 2012/0007113 A1 | 1/2012 | Hwang et al. | |
| 2012/0037930 A1* | 2/2012 | Hoppel | H01L 33/0079 257/88 |
| 2012/0056157 A1 | 3/2012 | Hikosaka et al. | |
| 2012/0112162 A1 | 5/2012 | Shin | |
| 2013/0069034 A1 | 3/2013 | Hirayama | |
| 2013/0112943 A1 | 5/2013 | Tanaka et al. | |
| 2013/0270520 A1 | 10/2013 | Ishizaki | |
| 2014/0183447 A1* | 7/2014 | Nago | H01L 33/325 257/13 |
| 2014/0319454 A1 | 10/2014 | Park et al. | |
| 2014/0326948 A1 | 11/2014 | Tångring et al. | |
| 2016/0064598 A1* | 3/2016 | Choi | H01L 33/06 257/13 |
| 2017/0033260 A1* | 2/2017 | Huang | H01L 33/002 |
| 2017/0125631 A1* | 5/2017 | Lee | H01L 33/06 |

FOREIGN PATENT DOCUMENTS

| | | |
|---|---|---|
| DE | 102006046237 A1 | 1/2008 |
| DE | 102011115312 A1 | 4/2013 |
| EP | 1914813 A2 | 4/2008 |
| JP | 5102604 A | 4/1993 |
| JP | H07235732 A | 9/1995 |
| JP | 2008166712 A | 7/2008 |
| JP | 201219218 A | 1/2012 |
| KR | 20130032105 | 3/2013 |

* cited by examiner

OPTOELECTRONIC SEMICONDUCTOR CHIP COMPRISING A MULTI-QUANTUM WELL COMPRISING AT LEAST ONE HIGH BARRIER LAYER

CROSS-REFERENCE TO RELATED APPLICATIONS

This is a continuation application of U.S. application Ser. No. 14/907,230, entitled "Optoelectronic Semiconductor Chip Comprising a Multi-Quantum Well Comprising at Least One High Barrier Layer" which was filed on Jan. 22, 2016 which is a national phase filing under section 371 of PCT/EP2014/065750, filed Jul. 22, 2014, which claims the priority of German patent application 10 2013 107 969.5, filed Jul. 25, 2013, all of which are incorporated herein by reference in its entirety.

TECHNICAL FIELD

The invention relates to an optoelectronic semiconductor chip which has an active layer in the form of a multiple quantum well structure.

BACKGROUND

In radiation-emitting optoelectronic semiconductor chips, such as, for example, LED chips or laser diode chips, the emission of radiation is usually dependent upon the operating temperature. Typically a decrease in the efficiency of radiation generation is observable with increasing temperature. In the case of very high operating temperatures, the reduced efficiency of radiation generation can lead to a significant decrease in brightness. For example, in the case of radiation-emitting semiconductor chips that contain an InGaAlP semiconductor material and emit in a wavelength range of from 550 nm to 640 nm, an increase in temperature from room temperature to a temperature of about 100° C. can result in a decrease in brightness of up to 80 percent if no suitable measures are taken to stabilize the radiation emission.

SUMMARY

The invention is based on the problem of defining a radiation-emitting optoelectronic semiconductor chip which is distinguished by a reduced temperature dependence of the radiation emission.

According to at least one embodiment, the optoelectronic semiconductor chip comprises a p-type semiconductor region, an n-type semiconductor region, and an active layer arranged between the p-type semiconductor region and the n-type semiconductor region, which active layer is in the form of a multiple quantum well structure. The multiple quantum well structure has a plurality of alternating quantum well layers and barrier layers, the barrier layers having a larger electronic band gap than the quantum well layers.

In the optoelectronic semiconductor chip, advantageously at least one of the barrier layers of the multiple quantum well structure which is arranged closer to the p-type semiconductor region than to the n-type semiconductor region is a high barrier layer. A high barrier layer is to be understood here and hereinbelow as being a barrier layer that has an electronic band gap $E_{hb}$ which is larger than an electronic band gap $E_b$ of the other barrier layers of the multiple quantum well structure. In other words, the barrier layers of the multiple quantum well structure, with the exception of the at least one high barrier layer, each have an electronic band gap $E_b$, while the electronic band gap in one or more high barrier layers which are arranged closer to the p-type semiconductor region than to the n-type semiconductor region is raised to a value $E_{hb} > E_b$. To achieve the larger electronic band gap $E_{hb}$ of the at least one high barrier layer, the at least one high barrier layer advantageously has a material composition that differs from the material composition of the other barrier layers of the multiple quantum well structure. The other barrier layers of the multiple quantum well structure which are not in the form of high barrier layers advantageously each have the same material composition and the same electronic band gap $E_b$.

The insertion of the at least one high barrier layer in a region of the multiple quantum well structure that faces towards the p-type semiconductor region has the advantage that the high barrier layer acts as a charge carrier barrier especially for holes. It has been found, in particular, that it is more difficult for holes to pass through the high barrier layer than for electrons. The holes injected into the multiple quantum well structure by the p-type semiconductor region therefore cannot disperse unimpeded in the entire multiple quantum well structure, but collect preferentially in the quantum well layer or the plurality of quantum well layers that are arranged between the p-type semiconductor region and the at least one high barrier layer. As a result of this non-uniform distribution of the holes in the multiple quantum well structure, the efficiency of radiation generation declines particularly at low temperatures, such as, for example, at room temperature. At higher temperatures, however, it is easier for the holes to pass through the high barrier layer in the region of the multiple quantum well structure that faces towards the p-type semiconductor region. With increasing temperature the holes become distributed more uniformly in the multiple quantum well structure, so that charge carrier recombinations for generating radiation take place in a larger region of the multiple quantum well structure. For that reason, the decrease in the efficiency of radiation generation caused by the at least one high barrier layer is the smaller, the higher the temperature.

In the case of the multiple quantum well structure described herein, a decrease in the efficiency of radiation generation at low temperatures, especially at room temperature, caused by the at least one high barrier layer inserted into the quantum well structure is deliberately accepted in order to counteract the reduced efficiency that is typically observed in radiation-emitting semiconductor devices at increasing temperatures. Typically the efficiency of radiation-emitting semiconductor devices declines with increasing temperature, because the confinement of charge carriers in the active zone becomes poorer as a result of the greater mobility of the charge carriers and accordingly increasing losses occur in the form of non-radiating recombinations outside the active layer. The insertion of the at least one high barrier layer into a region of the multiple quantum well structure that faces towards the p-type semiconductor region gives rise to an opposing effect as a result of which the efficiency of radiation generation increases with increasing temperature. In that way, a decrease in brightness customarily observed with increasing temperature is reduced or preferably even compensated. The optoelectronic semiconductor chip is therefore distinguished by an improved temperature stability of the brightness of the emitted radiation.

According to a preferred embodiment, the at least one high barrier layer has an electronic band gap $E_{hb}$ for which the following applies: $E_{hb} - E_b \geq 0.05$ eV. The material composition of the high barrier layer is therefore preferably chosen to be such that the high barrier layer has an electronic band gap at least 0.05 eV greater than the other barrier layers. In an especially preferred variant, the electronic band gap $E_{hb}$ of the at least one high barrier layer is even 0.1 eV greater than the electronic band gap of the other barrier layers.

The multiple quantum well structure preferably has not more than 10 high barrier layers. The number of high barrier layers in the multiple quantum well structure is preferably between 1 and 10, especially preferably between 1 and 5.

In one embodiment of the optoelectronic semiconductor chip, the first k barrier layers of the multiple quantum well structure starting from the p-type semiconductor region are high barrier layers, where k is a number between 1 and 10 and especially preferably between 1 and 5.

In a preferred embodiment, the multiple quantum well structure has just one high barrier layer. With the exception of the just one high barrier layer, preferably all other barrier layers each have the same band gap $E_b$. The insertion of just one high barrier layer has the advantage that the efficiency of radiation generation at room temperature is reduced to a lesser extent than when a plurality of high barrier layers is used.

When just one high barrier layer is used, that layer is preferably arranged between a quantum well layer that is the $m^{th}$ quantum well layer starting from the p-type semiconductor region and the immediately adjacent quantum well layer, where m is a number between 1 and 20, preferably between 1 and 10. In other words, in such an embodiment between 1 and 20, preferably between 1 and 10, quantum well layers are arranged between the p-type semiconductor region and the high barrier layer, and all other quantum well layers are arranged between the high barrier layer and the n-type semiconductor region. In the case of low operating temperatures, the holes therefore accumulate preferentially in the m quantum well layers between the p-type semiconductor region and the high barrier layer.

In such an embodiment, in particular m=1 can hold true. In that case, the high barrier layer is arranged between the first quantum well layer and the second quantum well layer, starting from the p-type semiconductor region. In such an embodiment, therefore, only the outermost quantum well layer of the multiple quantum well structure is separated from the other quantum well layers by means of the high barrier layer.

In a further embodiment, the multiple quantum well structure has not only one high barrier layer but a plurality of high barrier layers which are arranged closer to the p-type semiconductor region than to the n-type semiconductor region. When a plurality of high barrier layers is used it may possibly be necessary to accept an even greater decrease in efficiency at room temperature, but this offers the possibility of reducing or even compensating even greater reductions in brightness at high temperatures. Accordingly, although the brightness at room temperature is significantly reduced in comparison with a multiple quantum well structure without high barrier layers, its temperature stability is substantially improved.

The multiple quantum well structure can be based on a phosphide compound semiconductor, especially $In_xAl_yGa_{1-x-y}P$ where $0 \leq x \leq 1$, $0 \leq y \leq 1$ and $x+y \leq 1$, and be intended, for example, for emission of radiation in the wavelength range of from 550 nm to 640 nm. In the case of optoelectronic semiconductor chips having such an active layer, the at least one high barrier layer is especially advantageous, because such optoelectronic semiconductor chips typically exhibit a strong temperature dependence of the emitted brightness, which dependence can be reduced or even compensated by means of the at least one high barrier layer.

Alternatively, the multiple quantum well structure can be based on a nitride compound semiconductor, especially $In_xAl_yGa_{1-x-y}N$ where $0 \leq x \leq 1$, $0 \leq y \leq 1$ and $x+y \leq 1$, and be intended, for example, for emission in the ultraviolet or blue spectral range. Furthermore, the multiple quantum well structure can also be based on an arsenide compound semiconductor, especially $In_xAl_yGa_{1-x-y}As$ where $0 \leq x \leq 1$, $0 \leq y \leq 1$ and $x+y \leq 1$, and be intended for an emission in the red and/or infrared spectral range, for example, at approximately from 700 nm to 800 nm.

In a preferred embodiment, the at least one high barrier layer and the other barrier layers each comprise $In_xAl_yGa_{1-x-y}P$, $In_xAl_yGa_{1-x-y}N$ or $In_xAl_yGa_{1-x-y}As$ where $0 \leq x \leq 1$, $0 \leq y \leq 1$ and $x+y \leq 1$, the aluminum content y of the at least one high barrier layer being greater than the aluminum content y of the other barrier layers. The greater aluminum content advantageously brings about an enlargement of the electronic band gap of the high barrier layer in comparison with the other barrier layers.

The number of other barrier layers of the multiple quantum well structure that are not configured as high barrier layers and each have the same electronic band gap $E_b$ is advantageously at least 10, preferably at least 20. The number of other barrier layers can especially be between 10 and 100. The number of other barrier layers is advantageously at least 5 times and especially preferably at least 10 times as great as the number of high barrier layers having the increased band gap.

In a further advantageous embodiment, at least one quantum well layer that adjoins the at least one high barrier layer on a side facing towards the p-type semiconductor region has an electronic band gap $E_{lw}$ that is smaller than the band gap $E_w$ of the other quantum well layers. It has been found that in a quantum well layer that adjoins the at least one high barrier layer on a side facing towards the p-type semiconductor region, a very high charge carrier density develops as a result of the barrier action. This can have the result that charge carrier recombinations also from more highly excited states take place, such recombinations causing emission of radiation of greater energy and accordingly of shorter wavelength. A resulting shift in the emission spectrum towards a shorter wavelength can advantageously be reduced or even entirely compensated if the quantum well layer that adjoins the at least one high barrier layer has a smaller band gap than the other quantum well layers.

An alternative way of reducing or compensating the effect of a shift of the emission spectrum towards a shorter wavelength is for at least one quantum well layer that adjoins the at least one high barrier layer on a side facing towards the p-type semiconductor region to have a greater thickness than the other quantum well layers. In a similar way to the reduction of the electronic band gap, an increase in the thickness of the quantum well layer also leads to an increase in the emitted wavelength and accordingly to a reduction or compensation of the undesired effect.

BRIEF DESCRIPTION OF THE DRAWINGS

The invention is explained in greater detail below with reference to exemplified embodiments in conjunction with FIGS. 1 to 6, wherein.

In the Figures, elements that are identical or have identical action are denoted by the same reference numerals. The elements illustrated and the relative sizes of the elements to one another should not be regarded as to scale.

DETAILED DESCRIPTION OF ILLUSTRATIVE EMBODIMENTS

Figure 1:
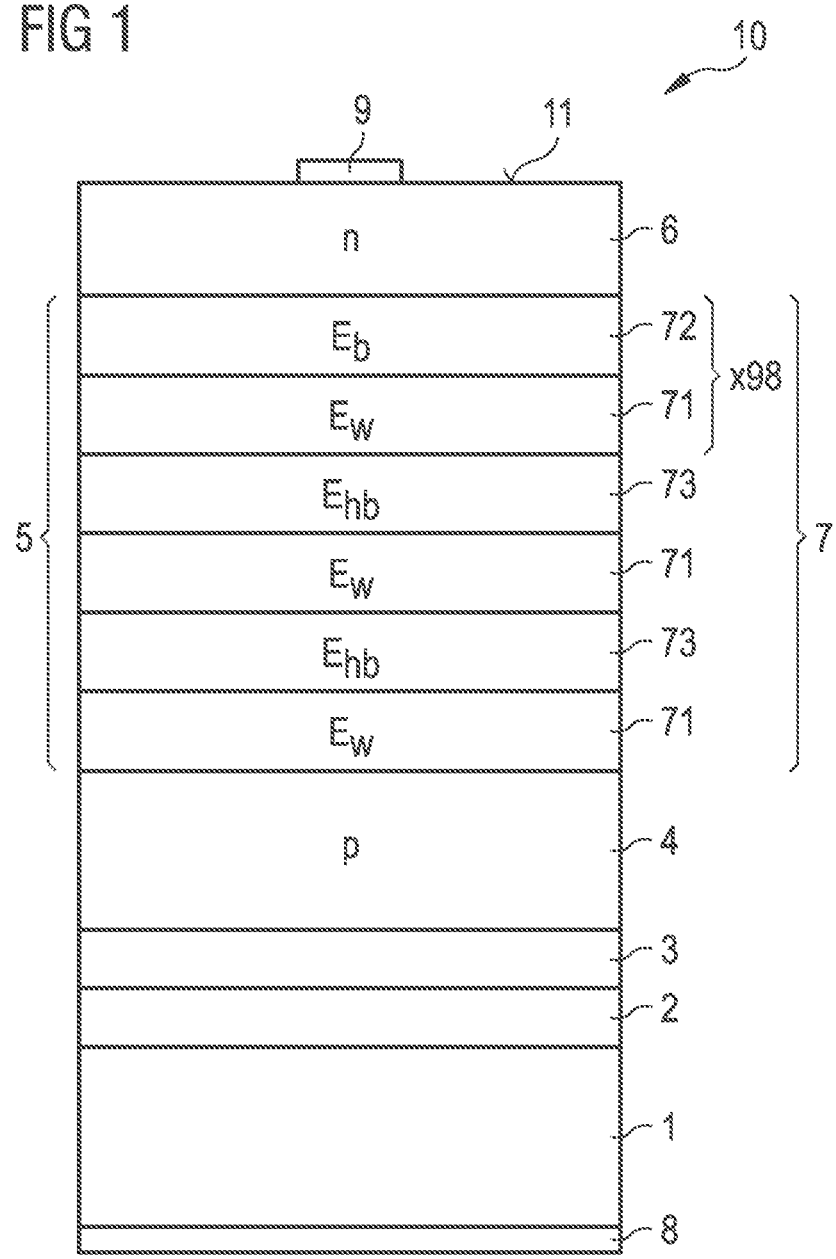
FIG. 1 is a diagrammatic view of a cross-section through an optoelectronic semiconductor chip according to a first exemplified embodiment.

The optoelectronic semiconductor chip 10 according to a first exemplified embodiment shown in FIG. 1 is an LED chip which has a p-type semiconductor region 4, an n-type semiconductor region 6, and an active layer 5 suitable for emission of radiation which is arranged between the p-type semiconductor region 4 and the n-type semiconductor region 6. The exemplified embodiment of the optoelectronic semiconductor chip 10 is what is known as a thin-film semiconductor chip from which a growth substrate originally used for epitaxial growth of the semiconductor layers 4, 5, 6 has been detached and instead the semiconductor layer sequence has been joined to a carrier substrate 1 different from the growth substrate by means of a connecting layer 2, especially a solder layer. In such a thin-film light-emitting diode chip 10, the p-type semiconductor region 4 usually faces towards the carrier substrate 1. Between the p-type semiconductor region 4 and the carrier substrate 1 there is advantageously arranged a mirror layer 3 by means of which radiation emitted in the direction of the carrier substrate 1 is advantageously deflected in the direction towards a radiation exit surface 11 of the optoelectronic semiconductor chip. The mirror layer 3 is, for example, a metal layer that comprises Ag, Al or Au.

For electrical contacting of the optoelectronic semiconductor chip 10 it is possible, for example, for a first contact layer 8 to be provided on a rear side of the carrier substrate 1 and for a second contact layer 9 to be provided on a sub-region of the radiation exit surface 11.

The p-type semiconductor region 4 and the n-type semiconductor region 6 can each be composed of a plurality of sublayers and need not necessarily consist exclusively of p-doped layers or n-doped layers, but can also have, for example, one or more undoped layers.

As an alternative to the exemplified embodiment shown, the optoelectronic semiconductor chip 10 could also have an opposite polarity, that is to say the n-type semiconductor region 6 could face towards a substrate and the p-type semiconductor region 4 could face towards a radiation exit surface 11 of the optoelectronic semiconductor chip (not shown). This is usually the case in optoelectronic semiconductor chips in which the growth substrate used for epitaxial growth of the semiconductor layers is not detached, because the n-type semiconductor region is usually grown onto the growth substrate first.

The active layer 5 of the optoelectronic semiconductor chip 10 intended for emission of radiation is in the form of a multiple quantum well structure 7. The multiple quantum well structure 7 has a plurality of alternately arranged quantum well layers 71 and barrier layers 72, 73. In the exemplified embodiment shown, the multiple quantum well structure 7 has one hundred layer pairs each composed of a quantum well layer 71 and a barrier layer 72, 73. The quantum well layers 71 each have an electronic band gap $E_w$. Starting from the n-type semiconductor region 6 of the optoelectronic semiconductor chip 10, the first 98 barrier layers each have an electronic band gap $E_b$.

The two barrier layers 73 located closest to the p-type semiconductor region 4 are each in the form of a high barrier layer 73 having a larger electronic band gap $E_{hb}$ than the other barrier layers 72. For that purpose the high barrier layers 73 differ in material composition from the other barrier layers 72. The larger electronic band gap $E_{hw}$ of the high barrier layers 73 can have been created especially by the high barrier layers 73 having a greater aluminum content than the other barrier layers 72. For example, the high barrier layers 73 can comprise $In_{0.5}Al_{0.5}P$ and the other barrier layers 72 can comprise $In_{0.5}Ga_{0.25}Al_{0.25}P$.

As a result of the increased electronic band gap $E_{hb}$, the high barrier layers 73 act particularly as barriers for holes and make it more difficult for holes from the p-type semiconductor region 4 to pass into the portion of the quantum well structure 7 that faces towards the n-type semiconductor region 6. During operation of the optoelectronic semiconductor chip 10, the concentration of holes in the quantum well layers 71 that adjoin the boundary faces of the high barrier layers 73 facing towards the p-type semiconductor region 4 is therefore higher than in the other 98 quantum well layers 71 of the multiple quantum well structure 7. Particularly at low operating temperatures, this therefore results in a non-uniform charge carrier distribution in the multiple quantum well structure 7, which reduces the efficiency of radiation generation.

At higher operating temperatures, the holes are able to pass through the high barrier layers 73 more easily, so that the charge carrier distribution becomes more uniform with increasing temperature. In this way the efficiency of radiation generation rises with increasing temperature. This effect advantageously reduces or compensates the opposing effect that the efficiency of radiation generation in the active layer 5 declines with increasing temperature on account of a poorer confinement of charge carriers in the multiple quantum well structure 7, as is typically observed in radiation-emitting semiconductor chips. The optoelectronic semiconductor chip 10 is therefore distinguished by an improved temperature stability of the emitted brightness.

The optoelectronic semiconductor chip 10 shown in FIG. 1 is intended, for example, for emission at a wavelength of 590 nm. It has been found that on account of the two high barrier layers 73 the brightness at room temperature declines by about 15 percent in comparison with an otherwise identical semiconductor chip in which all one hundred barrier layers 72 are formed from $In_{0.5}Ga_{0.25}Al_{0.25}P$. At an operating temperature of 100° C., however, the optoelectronic semiconductor chip 10 emits the same brightness as an otherwise identical conventional semiconductor chip in which all the barrier layers have the same electronic band gap. The relative change in brightness with operating temperature is therefore smaller in the case of the optoelectronic semiconductor chip 10 according to the exemplified embodiment than in the case of the comparison example in which all the barrier layers have the same electronic band gap.

Figure 2:
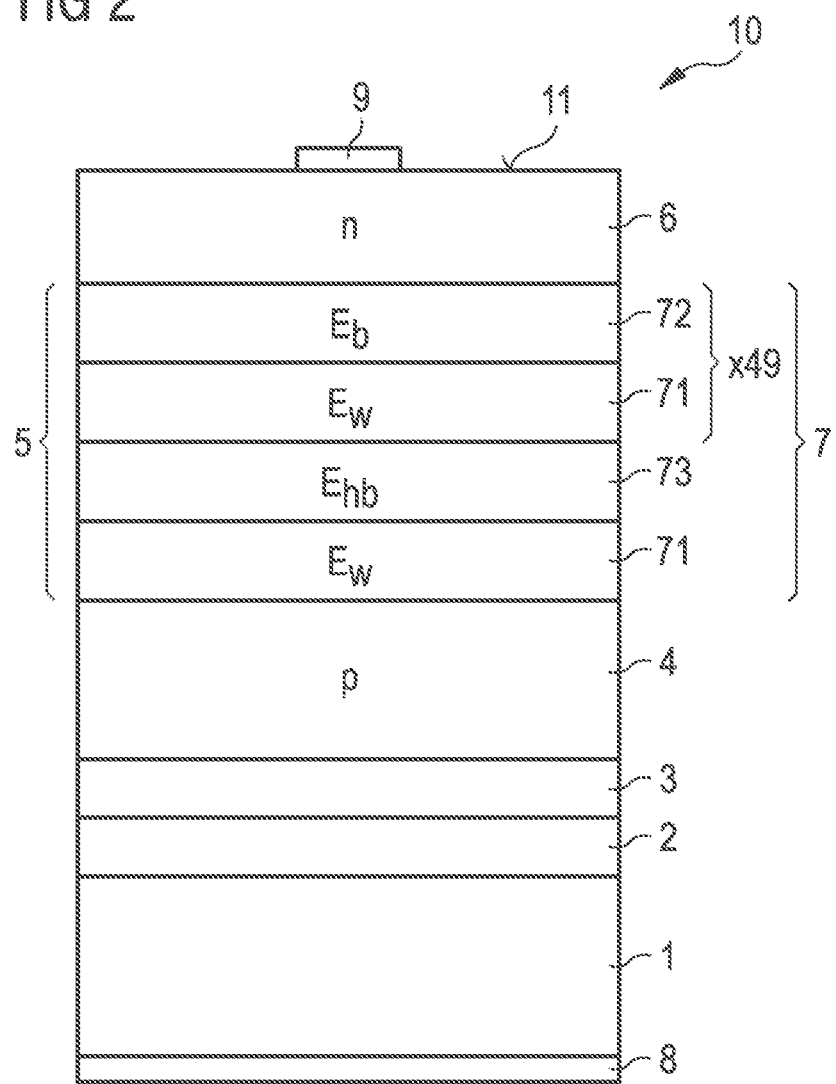
FIG. 2 is a diagrammatic view of a cross-section through an optoelectronic semiconductor chip according to a second exemplified embodiment.

FIG. 2 shows a further exemplified embodiment of an optoelectronic semiconductor chip 10 which is intended for emission at a wavelength of 615 nm. The optoelectronic semiconductor chip 10 differs from the exemplified embodiment of FIG. 1 in that the multiple quantum well structure 7 acting as active layer 5 has fifty layer pairs composed of quantum well layers 71 and barrier layers 72, 73. In contrast to the previous exemplified embodiment, only the first barrier layer 73 starting from the p-type semiconductor region 4 is configured as a high barrier layer 73. The high barrier layer 73 contains $In_{0.5}Al_{0.5}P$ and therefore has a larger electronic band gap than the 49 other barrier layers 72, which each comprise $In_{0.5}Ga_{0.25}Al_{0.25}P$.

As a result of the fact that the first barrier layer starting from the p-type semiconductor region 4 is configured as a high barrier layer 73, the brightness of the optoelectronic semiconductor chip 10 at room temperature is reduced by about 17 percent in comparison with an otherwise identical optoelectronic semiconductor chip in which all the barrier layers have the same electronic band gap. In the exemplified embodiment shown in FIG. 2, the relative decrease in brightness when the temperature rises to 100° C. is about 40 percent instead of 50 percent in the case of a conventional semiconductor chip having barrier layers with the same electronic band gap. Accordingly, in the exemplified embodiment the relative loss of brightness between room temperature and an operating temperature of 100° C. is advantageously reduced by 20 percent in comparison with a conventional semiconductor chip.

Further advantageous embodiments and advantages of the optoelectronic semiconductor chip 10 shown in FIG. 2 correspond to the first exemplified embodiment and are therefore not described again in detail.

Figure 3:
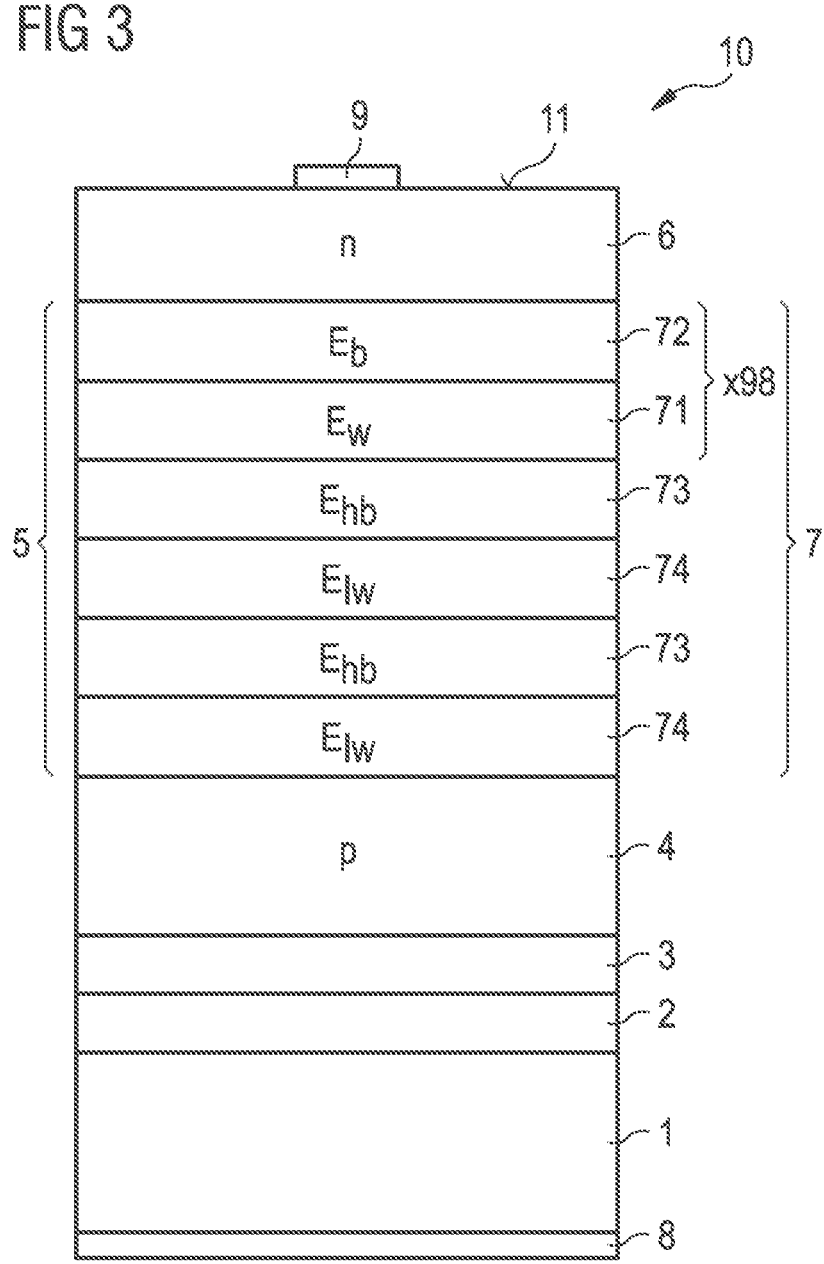
FIG. 3 is a diagrammatic view of a cross-section through an optoelectronic semiconductor chip according to a third exemplified embodiment.

FIG. 3 shows a further exemplified embodiment of an optoelectronic semiconductor chip 10 which is a modification of the exemplified embodiment of FIG. 1. The exemplified embodiment of FIG. 3 differs from the exemplified embodiment of FIG. 1 in that the two quantum well layers 74 that adjoin the two high barrier layers 73 on a side facing towards the p-type semiconductor region 4 have an electronic band gap $E_{lw}$ that is smaller than the band gap $E_w$ of the other quantum well layers 71. This is advantageous because it has been found that the high barrier layers 73 give rise to an increased concentration of holes in the quantum well layers 74 adjoining in the direction of the p-type semiconductor region 4. As a result of the high charge carrier concentration in those quantum well layers 74, radiation-generating charge carrier recombinations also from more highly excited states take place, with the result that higher-energy radiation of shorter wavelength is emitted. That effect is reduced or even compensated as a result of the fact that the electronic band gap $E_{lw}$ of the quantum well layers 74 that adjoin the high barrier layers 73 on a side facing towards the p-type semiconductor region 4 is reduced in comparison with the other quantum well layers 71. Further advantageous embodiments and advantages of the optoelectronic semiconductor chip 10 shown in FIG. 3 correspond to the first exemplified embodiment and are therefore not described again in detail.

Figure 4:
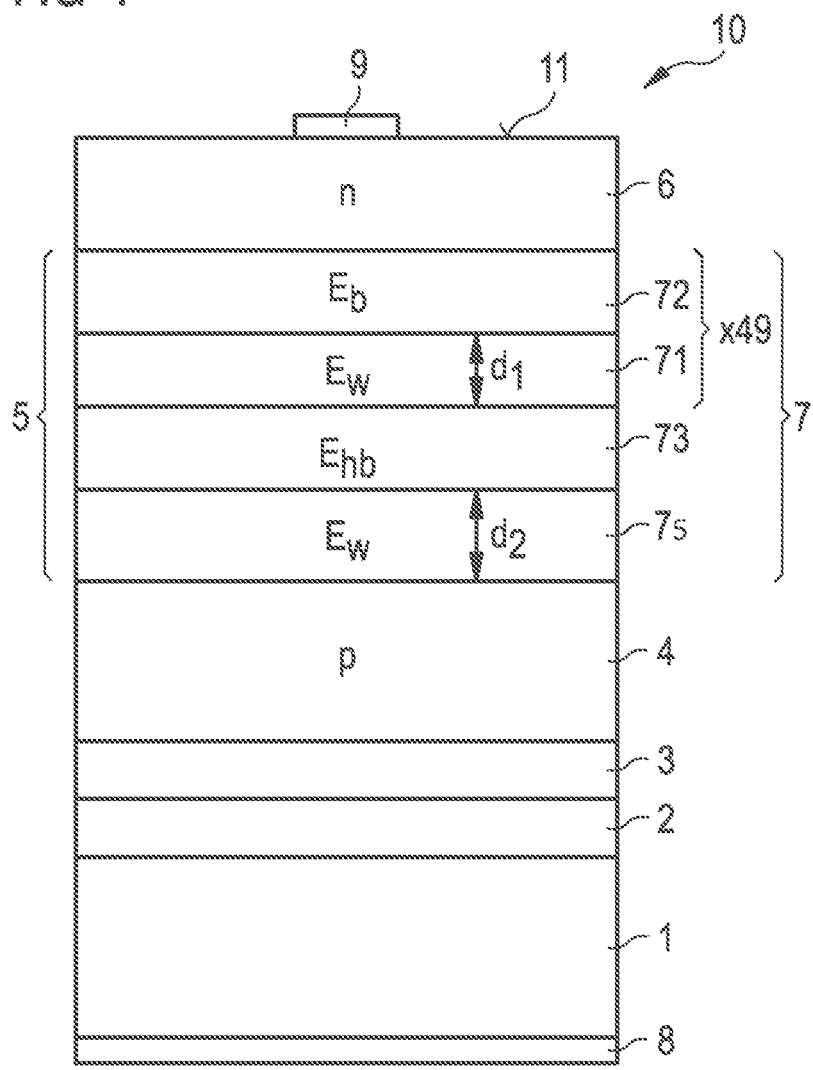
FIG. 4 is a diagrammatic view of a cross-section through an optoelectronic semiconductor chip according to a fourth exemplified embodiment.

FIG. 4 shows a further exemplified embodiment of an optoelectronic semiconductor chip 10 which is a modification of the exemplified embodiment shown in FIG. 2. The exemplified embodiment of FIG. 4 differs from the exemplified embodiment of FIG. 2 in that the quantum well layer 75 that adjoins the high barrier layer 73 on a side facing towards the p-type semiconductor region 4 has a thickness $d_2$ that is greater than the thickness $d_1$ of the other quantum well layers 71. Increasing the thickness of the quantum well layer 75 adjoining the high barrier layer 73 represents an alternative to the method shown in FIG. 3 of reducing the emission wavelength of the radiation emitted in the quantum well layer 75 in order to reduce or fully compensate an opposing effect caused by charge carrier recombinations from more highly excited states. As regards further advantageous embodiments, the exemplified embodiment shown in FIG. 4 corresponds to the exemplified embodiment shown in FIG. 2.

Figure 5:
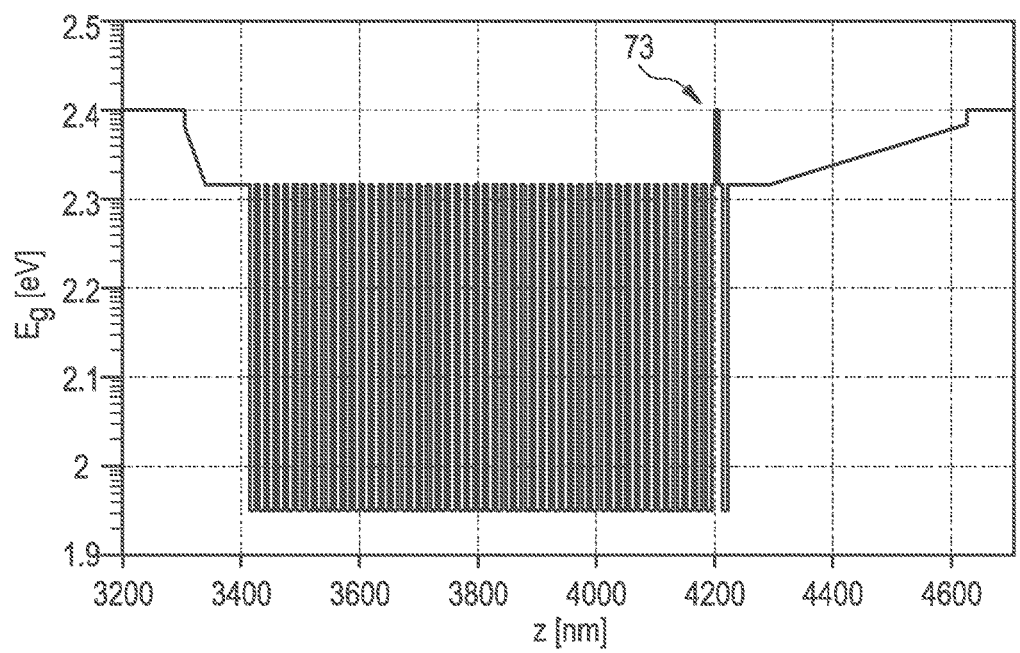
FIG. 5 is a graph showing the electronic band gap in dependence upon a spatial co-ordinate z running in the perpendicular direction in a fifth exemplified embodiment.

FIG. 5 shows the profile of the electronic band gap $E_g$ in dependence upon a spatial co-ordinate z running in the perpendicular direction in a further exemplified embodiment of the optoelectronic semiconductor chip 10. It is a semiconductor chip intended for emission at a wavelength of 615 nm, which is based on the material system InGaAlP and, as in the exemplified embodiment shown in FIG. 2, has fifty layer pairs composed of alternating quantum well layers and barrier layers. The first barrier layer starting from the p-type semiconductor region is in the form of a high barrier layer 73 which has a substantially larger electronic band gap than the other barrier layers of the multiple quantum well structure. The function of the high barrier layer 73 and the advantages arising therefrom correspond to the exemplified embodiments described above and are therefore not described again in detail here.

As an alternative to the exemplified embodiment shown in FIG. 5 it would also be possible for the high barrier layer 73 to be arranged not after the first quantum well layer starting from the p-type semiconductor region 4, but only after a plurality of quantum well layers. In particular, the high barrier layer 73 can be arranged between a quantum well layer that is the $m^{th}$ quantum well layer starting from the p-type semiconductor region and the immediately adjacent quantum well layer, where m is a number between 1 and 20, preferably between 1 and 10.

Figure 6:
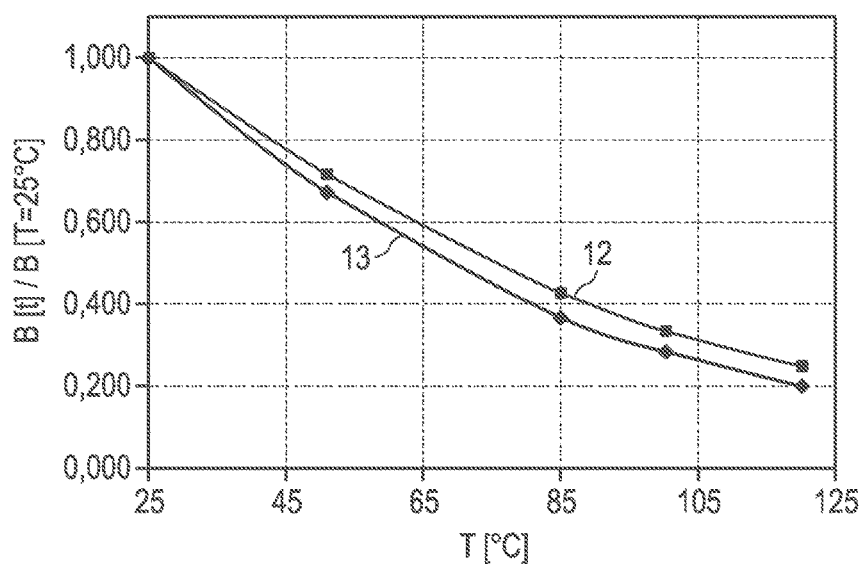
FIG. 6 is a graph showing the relative brightness B(T)/B(T=25° C.) in dependence upon the temperature T in an optoelectronic semiconductor chip according to a sixth exemplified embodiment in comparison with a conventional optoelectronic semiconductor chip.

FIG. 6 shows the measured relative brightness B(T)/B (T=25° C.) for an optoelectronic semiconductor chip according to a further exemplified embodiment (curve 12) in comparison with a conventional semiconductor chip (curve 13) in dependence upon the ambient temperature T. The optoelectronic semiconductor chip according to the exemplified embodiment is a light-emitting diode chip which is based on the semiconductor material InGaAlP and has a multiple quantum well structure having 100 layer pairs composed of quantum well layers and barrier layers, the first 10 barrier layers starting from the p-type semiconductor region being configured as high barrier layers which have a larger electronic band gap than the other 90 barrier layers of the multiple quantum well structure. The comparison example of a conventional semiconductor chip is an otherwise identically constructed semiconductor chip in which all 100 barrier layers have the same electronic band gap.

At a low temperature T, the high barrier layers of the exemplified embodiment of an optoelectronic semiconductor chip reduce the emitted brightness, because the charge carrier transport of holes into the 90 quantum well layers that follow the high barrier layers in the direction towards the n-type semiconductor region is reduced. That effect declines with increasing temperature T, because the charge carriers have greater mobility with increasing temperature and are accordingly able to pass through the high barrier layers more easily. In the optoelectronic semiconductor chip according to the exemplified embodiment, the brightness therefore declines with increasing temperature to a lesser extent than in the case of the conventional semiconductor chip. For example, the decrease in brightness at a temperature T=100° C. is about 7 percent less than in the case of a conventional semiconductor chip.

The description of the invention with reference to the exemplified embodiments does not limit the invention thereto; rather, the invention encompasses any novel feature and any combination of features, including in particular any combination of features in the patent claims, even if that feature or that combination is not itself explicitly defined in the claims or exemplified embodiments.

What is claimed is:

1. An optoelectronic semiconductor chip comprising:
   a p-type semiconductor region;
   an n-type semiconductor region; and
   an active layer suitable for emission of radiation arranged between the p-type semiconductor region and the n-type semiconductor region, the active layer comprising a multiple quantum well structure, the multiple quantum well structure having a plurality of alternating quantum well layers and barrier layers, wherein a barrier layer arranged closer to the p-type semiconductor region than to the n-type semiconductor region is a high barrier layer having an electronic band gap $E_{hb}$ that is larger than electronic band gaps $E_b$ of other barrier layers, and wherein a quantum well layer that adjoins the high barrier layer on a side of the high barrier layer facing towards the p-type semiconductor region has a thickness that is greater than thicknesses of other quantum well layers.

2. The optoelectronic semiconductor chip according to claim 1, wherein the high barrier layer has a band gap $E_{hb}$ for which the following applies: $E_{hb} - E_b \geq 0.05$ eV.

3. The optoelectronic semiconductor chip according to claim 1, wherein the multiple quantum well structure has not more than 10 high barrier layers.

4. The optoelectronic semiconductor chip according to claim 3, wherein first k barrier layers starting from the p-type semiconductor region are high barrier layers, where k is a number between 1 and 10.

5. The optoelectronic semiconductor chip according to claim 1, wherein the multiple quantum well structure has just one high barrier layer.

6. The optoelectronic semiconductor chip according to claim 5, wherein the high barrier layer is arranged between a quantum well layer that is a mth quantum well layer starting from the p-type semiconductor region and an immediately adjacent quantum well layer, where m is a number between 1 and 20.

7. The optoelectronic semiconductor chip according to claim 6, wherein m=1.

8. The optoelectronic semiconductor chip according to claim 1, wherein the multiple quantum well structure has a plurality of high barrier layers that are arranged closer to the p-type semiconductor region than to the n-type semiconductor region.

9. The optoelectronic semiconductor chip according to claim 1, wherein the high barrier layer and the other barrier layers each comprise $In_xAl_yGa_{1-x-y}P$ or $In_xAl_yGa_{1-x-y}N$, where $0 \leq x \leq 1$, $0 \leq y \leq 1$ and $x+y \leq 1$, and wherein an aluminum content y of the high barrier layer is greater than an aluminum content y of the other barrier layers.

10. The optoelectronic semiconductor chip according to claim 1, wherein the high barrier layer and the other barrier layers each comprise $In_xAl_yGa_{1-x-y}As$, where $0 \leq x \leq 1$, $0 \leq y \leq 1$ and $x+y \leq 1$, and wherein an aluminum content y of the high barrier layer is greater than an aluminum content y of the other barrier layers.

11. The optoelectronic semiconductor chip according to claim 1, wherein the chip includes at least 10 other barrier layers.

12. The optoelectronic semiconductor chip according to claim 11, wherein the chip includes at least 20 other barrier layers.

13. The optoelectronic semiconductor chip according to claim 1, wherein the number of other barrier layers having the band gap $E_b$ is at least 5 times as great as the number of high barrier layer(s) having the increased band gap $E_{hb}$.

14. The optoelectronic semiconductor chip according to claim 1, wherein the number of other barrier layers having the band gap $E_b$ is at least 10 times as great as the number of high barrier layer(s) having the increased band gap $E_{hb}$.

15. The optoelectronic semiconductor chip according to claim 1, wherein a quantum well layer that adjoins the high barrier layer on a side facing towards the p-type semiconductor region has an electronic band gap $E_{lw}$ that is smaller than a band gap $E_w$ of other quantum well layers.

16. The optoelectronic semiconductor chip according to claim 1, wherein the multiple quantum well structure is suitable for the emission of radiation in a wavelength range from 550 nm to 640 nm.

17. An optoelectronic semiconductor chip comprising:
    a p-type semiconductor region;
    an n-type semiconductor region; and
    an active layer suitable for emission of radiation arranged between the p-type semiconductor region and the n-type semiconductor region, the active layer comprising a multiple quantum well structure, the multiple quantum well structure having a plurality of alternating quantum well layers and barrier layers,
    wherein a barrier layer arranged closer to the p-type semiconductor region than to the n-type semiconductor region is a high barrier layer having an electronic band gap $E_{hb}$ that is larger than electronic band gaps $E_b$ of other barrier layers,
    wherein a quantum well layer that adjoins the high barrier layer on a side facing towards the p-type semiconductor region has a thickness that is greater than thicknesses of other quantum well layers,
    wherein the multiple quantum well structure has just one high barrier layer, and
    wherein the high barrier layer is arranged between a quantum well layer that is a mth quantum well layer starting from the p-type semiconductor region and an immediately adjacent quantum well layer, where m is a number between 1 and 20.

18. The optoelectronic semiconductor chip according to claim 17, wherein m=1.

* * * * *